(12) United States Patent
Goyal et al.

(10) Patent No.: US 8,378,728 B1
(45) Date of Patent: Feb. 19, 2013

(54) LEVEL SHIFTING FLIP-FLOP

(75) Inventors: Gaurav Goyal, Dehradun (IN);
Abhishek Mahajan, Changdigarh (IN);
Bipin B. Malhan, Bangalore (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/487,243

(22) Filed: Jun. 3, 2012

(51) Int. Cl.
*H03K 3/356* (2006.01)
*H03L 5/00* (2006.01)

(52) U.S. Cl. ........ 327/203; 327/202; 327/208; 327/212; 327/218; 327/333; 326/80; 326/95; 326/98

(58) Field of Classification Search .......... 327/199–203, 327/208–214, 218, 223–225, 333; 326/62, 326/80, 81, 93–98
See application file for complete search history.

(56) References Cited

U.S. PATENT DOCUMENTS

| | | | |
|---|---|---|---|
| 6,428,683 B1 | 8/2002 | Jaworowski | |
| 6,429,683 B1 | 8/2002 | Miller | |
| 6,954,100 B2 | 10/2005 | Dharne | |
| 7,009,424 B2 | 3/2006 | Khan | |
| 7,061,299 B2 | 6/2006 | Khan | |
| 7,102,410 B2 | 9/2006 | Khan | |
| 7,132,856 B2 * | 11/2006 | Hsu et al. | ........................ 326/81 |
| 7,187,205 B2 | 3/2007 | Ramaraju | |
| 7,443,223 B2 | 10/2008 | Bajkowshi | |
| 7,446,566 B1 | 11/2008 | Chrudimsky | |
| 7,548,093 B1 | 6/2009 | Priel | |
| 7,560,970 B2 | 7/2009 | Cook | |
| 7,671,629 B2 | 3/2010 | Zhang | |
| 7,683,668 B1 | 3/2010 | Thakur | |
| 7,737,757 B2 * | 6/2010 | Behrends et al. | ............. 327/333 |
| 7,777,522 B2 | 8/2010 | Yang | |
| 7,804,346 B2 * | 9/2010 | Park | .............................. 327/208 |
| 7,808,286 B1 | 10/2010 | Miller | |
| 7,816,948 B1 | 10/2010 | Sanchez | |
| 7,956,662 B2 | 6/2011 | Arora | |
| 8,179,178 B2 * | 5/2012 | Lundberg | ...................... 327/208 |

OTHER PUBLICATIONS

Bo Zhang, Lipin Liang, Xingjun Wang, "A New Level Shifter with Low Power in Multi-Voltage System," IEEE, 2006.

\* cited by examiner

*Primary Examiner* — Patrick O'Neill
(74) *Attorney, Agent, or Firm* — Charles Bergere

(57) ABSTRACT

A level shifting flip-flop for generating a level-shifted output signal based on an input signal includes a master stage and a slave stage. The slave stage has an integrated level shifting circuit. The slave stage level shifts a signal as it passes through the flip-flop, which eliminates the need of level shifting the signal after it is output from the flip-flop.

17 Claims, 2 Drawing Sheets

US 8,378,728 B1

LEVEL SHIFTING FLIP-FLOP

BACKGROUND OF THE INVENTION

The present invention relates generally to a digital electronic circuits, and more particularly, to a level shifting flip-flop.

Modern day systems-on-a-chips (SoCs) are designed to consume less power by using lower operating voltages. Multiple voltage domains operating at different voltage supply levels are used to decrease the overall operating voltage of the SoC. These multiple voltage domains require stepping up/down of voltage levels of signals that cross different voltage domains. Level shifter circuits are used to step up/down the logic signal level as it enters a different voltage level domain. Conventionally, a level shifter circuit is coupled to output terminals of a flip-flop, with the level shifter and the flip-flop forming a combination that is used to level shift output signals of the flip-flop.

FIG. 1 shows a schematic diagram of conventional level shifting circuitry 100 that includes a flip-flop 102 and a level shifter circuit 104. The flip-flop 102 receives an input signal (D) at a data input terminal and a clock signal (CP) at a clock input terminal. The flip-flop 102 processes the input signal based on the clock signal and generates output (Q) and inverted output signals (/Q) at output and inverted output terminals, respectively. The Q and /Q output signals are provided to an input terminal of the level-shifter circuit 104. The level shifter circuit 104 shifts the voltage level of the output signal from a first level to a second level to generate a level shifted output signal (Z) at an output terminal of the level shifter circuit 104.

There is a time delay between providing the input signal and obtaining the level-shifted output signal, which includes the time for the flip-flop 102 to generate the output signal Q and the time for the level shifter circuit 104 to generate the level-shifted output signal Z. This circuitry 100 processes the input signal D sequentially. Further, the circuitry 100 has a relatively large size and leads to higher power consumption than other SoC components.

Therefore, it would be advantageous to have a level shifting flip-flop that has low processing time, reduced size and power consumption, and that overcomes the above-mentioned limitations of the conventional circuitry 100.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
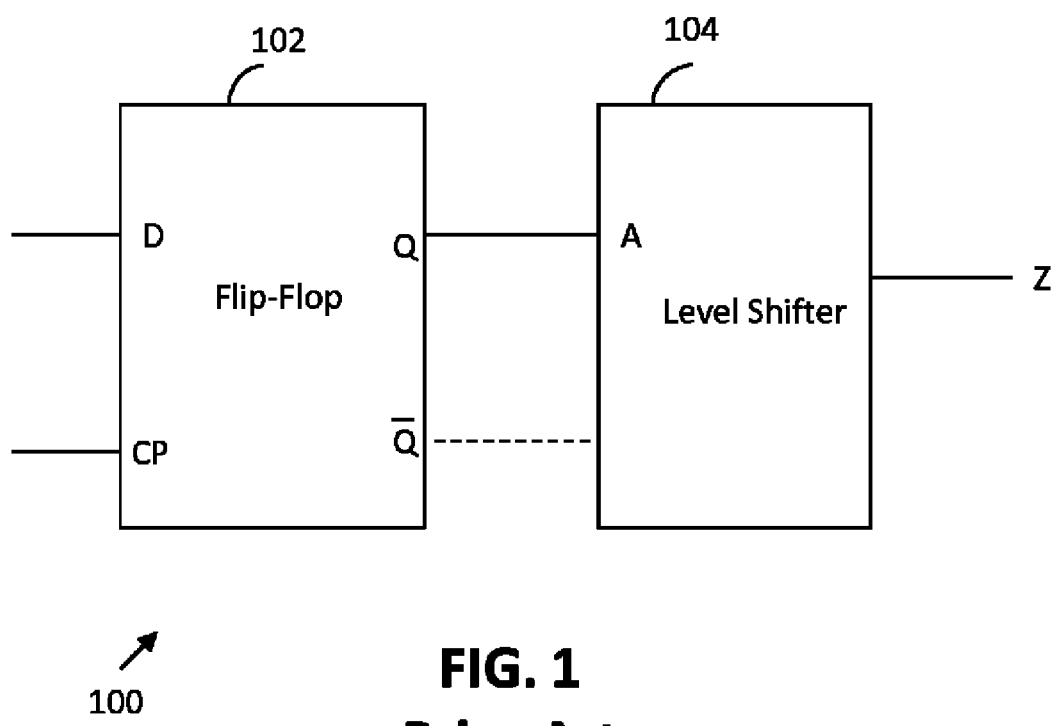
FIG. 1 is a schematic block diagram of conventional level shifting circuitry.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a flip-flop circuit for generating a level-shifted output signal based on an input signal and a clock signal is provided. The flip-flop circuit includes a master stage for receiving the input signal and the clock signal and generating an inverted clock signal, an internal clock signal, and a master stage output signal based on the input signal and the clock signal.

The master stage includes a first transistor having a source terminal that receives a first supply voltage, and a gate terminal for receiving the input signal; a second transistor having a source terminal connected to a drain terminal of the first transistor, and a gate terminal for receiving the internal clock signal; a third transistor having a drain terminal connected to a drain terminal of the second transistor, and a gate terminal that receives the inverted clock signal; a fourth transistor having a drain terminal connected to a source terminal of the third transistor, a gate terminal for receiving the input signal, and a source terminal connected to ground; a fifth transistor having a source terminal that receives the first supply voltage, and a gate terminal connected to the drain terminals of the second and third transistors; a sixth transistor having a drain terminal connected to a drain terminal of the fifth transistor, for generating a clocked input signal, a gate terminal connected to the gate terminal of the fifth transistor, and a source terminal connected to ground; and a first inverter having an input connected to the drain terminals of the fifth and sixth transistors for receiving the clocked input signal, and an output that provides the master stage output signal.

The master stage also has a seventh transistor having a source terminal that receives the first supply voltage, and a gate terminal connected to the output of the first inverter for receiving the clocked input signal; an eighth transistor having a source terminal connected to a drain terminal of the seventh transistor, and a gate terminal that receives the inverted clock signal; a ninth transistor having a drain terminal connected to a drain terminal of the eighth transistor, and a gate terminal that receives the internal clock signal, wherein the drain terminals of the eighth and ninth transistors are connected to the input of the first inverter; a tenth transistor having a drain terminal connected to a source terminal of the ninth transistor, a gate terminal connected to output of the first inverter for receiving the clocked input signal, and a source terminal connected to ground; a second inverter having an input that receives the clock signal and an output that provides the inverted clock signal; and a third inverter having an input connected to the output of the second inverter and receiving the inverted clock signal, and an output that provides the internal clock signal.

A slave stage is connected to the master stage for generating the level-shifted output signal. The slave stage includes: a seventeenth transistor having a source terminal that receives the first supply voltage, and a gate terminal connected to the output of the first inverter and receiving the master stage output signal; an eighteenth transistor having a source terminal connected to a drain terminal of the eighteenth transistor, and a gate terminal that receives the inverted clock signal; and a nineteenth transistor having a drain terminal connected to a drain terminal of the eighteenth transistor, and a gate terminal that receives the internal clock signal.

The slave stage also includes a twentieth transistor has a drain terminal connected to a source terminal of the nineteenth transistor, a gate terminal connected to the gate terminal of the thirteenth transistor and the output of the first inverter, and a source terminal connected to ground. A twenty-first transistor has a gate terminal that receives the internal clock signal. A twenty-second transistor has a drain terminal connected to a source terminal of the twenty-first transistor, a gate terminal connected to the output of the first inverter and receiving the master stage output signal, and a source terminal connected to ground. A twenty-third transistor having a source terminal connected to a drain terminal of the twenty-first transistor, a gate terminal that receives the inverted clock signal, and a drain terminal connected to the drain terminals of the seventeenth and eighteenth transistors. A twenty-fourth transistor has a drain terminal connected to the drain terminal of the twenty-third transistor, and a gate terminal that receives the internal clock signal. A twenty-fifth transistor has a source terminal that receives the first supply voltage, and a drain terminal connected to a source terminal of the twenty-fourth transistor. A twenty-sixth transistor having a source terminal that receives a second supply voltage, a gate terminal connected to a gate terminal of the twenty-fifth transistor, and a drain terminal connected to the drain terminal of the twenty-first transistor. A twenty-seventh transistor has a drain terminal connected to the drain terminal of the twenty-sixth transistor, and a gate terminal that receives the inverted clock signal. A twenty-eighth transistor has a drain terminal connected to a source terminal of the twenty-seventh transistor, a source terminal connected to ground, and a gate terminal connected to the gate terminals of the twenty-fifth and twenty-sixth transistors. A twenty-ninth transistor has a source terminal that receives the second supply voltage, a gate terminal connected to the drain terminal of the twenty-first transistor and the source terminal of the twenty-third transistor, and a drain terminal connected to the gate terminals of the twenty-fifth and twenty-sixth transistors. A thirtieth transistor has a drain terminal connected to the drain terminal of the twenty-ninth transistor, a gate terminal connected to the drain terminals of the eighteenth and nineteenth transistors, and a source terminal connected to ground. Finally, a fourth inverter is sconnected between the second supply voltage and ground. The fourth inverter has an input connected to the drain terminals of the twenty-ninth and thirtieth transistors, and an output that provides the level shifted output signal.

In another embodiment of the present invention, a flip-flop circuit for generating a level-shifted output signal based on an input signal and a clock signal is provided. The flip-flop circuit includes a master stage for receiving the input signal and the clock signal and generating an inverted clock signal, an internal clock signal, and a master stage output signal based on the input signal and the clock signal; and a slave stage, connected to the master stage, for generating the level-shifted output signal based on the inverted clock signal, the internal clock signal, and the master stage output signal.

The slave stage includes: a first transistor having a source terminal that receives a first supply voltage, and a gate terminal that receives the master stage output signal; a second transistor having a source terminal connected to a drain terminal of the first transistor, and a gate terminal that receives the inverted clock signal; a third transistor having a drain terminal connected to a drain terminal of the second transistor, and a gate terminal that receives the internal clock signal, wherein a clocked input signal is generated at a node between the drains of the second and third transistors; a fourth transistor having a drain terminal connected to a source terminal of the third transistor, a gate terminal connected to the gate terminal of the first transistor and receiving the master stage output signal, and a source terminal connected to ground; a fifth transistor having a gate terminal that receives the internal clock signal; a sixth transistor having a drain terminal connected to a source terminal of the fifth transistor, a gate terminal connected to the gate terminal of the first transistor for receiving the master stage output signal, and a source terminal connected to ground; a seventh transistor having a source terminal connected to a drain terminal of the fifth transistor, a gate terminal that receives the inverted clock signal, and a drain terminal connected to the drain terminals of the second and third transistors; an eighth transistor having a drain terminal connected to the drain terminal of the seventh transistor, and a gate terminal for receiving the internal clock signal; a ninth transistor having a source terminal that receiver the first supply voltage, and a drain terminal connected to a source terminal of the eighth transistor; and a tenth transistor having a source terminal that receives a second supply voltage, a gate terminal connected to a gate terminal of the ninth transistor, and a drain terminal connected to the source terminal of the seventh transistor.

The slave stage also includes: an eleventh transistor having a drain terminal connected to the drain terminal of the tenth transistor, and a gate terminal that receives the inverted clock signal; a twelfth transistor having a drain terminal connected to a source terminal of the eleventh transistor, a source terminal connected to ground, and a gate terminal connected to the gate terminal of the tenth transistor; a thirteenth transistor having a source terminal that receives the second supply voltage, a gate terminal connected to the drain terminal of the fifth transistor and the source terminal of the seventh transistor, and a drain terminal connected to the gate terminal of the ninth transistor; a fourteenth transistor having a drain terminal connected to the drain terminal of the thirteenth transistor, a source terminal connected to ground, and a gate terminal connected to the drain terminals of the second and third transistors for receiving the clocked input signal, wherein an inverted level-shifted output signal is output at the drain terminals of the thirteenth and fourteenth transistors; and a first inverter having an input connected to the drain terminals of the thirteenth and fourteenth transistors for receiving the inverted level shifted output signal, and an output terminal that provides the level shifted output signal.

Various embodiments of the present invention provide a level-shifting flip-flop for generating a level-shifted output signal based on an input signal. The level shifting flip-flop includes a master stage and a slave stage. The slave stage includes an integrated level shifting circuit. The slave stage level shifts a signal as it passes through the flip-flop, which eliminates the need of separate level-shifter circuit at an output of the flip-flop. As the output signal is level-shifted when it is generated in the slave-stage, the power consumption and area of the level shifting flip-flop are reduced as compared to conventional circuitry that has a combination of a flip-flop and a level-shifter circuit. Additionally, shifting the voltage level while generating the output signal results in a shorter processing time for generating the level-shifted output signal.

Figure 2:
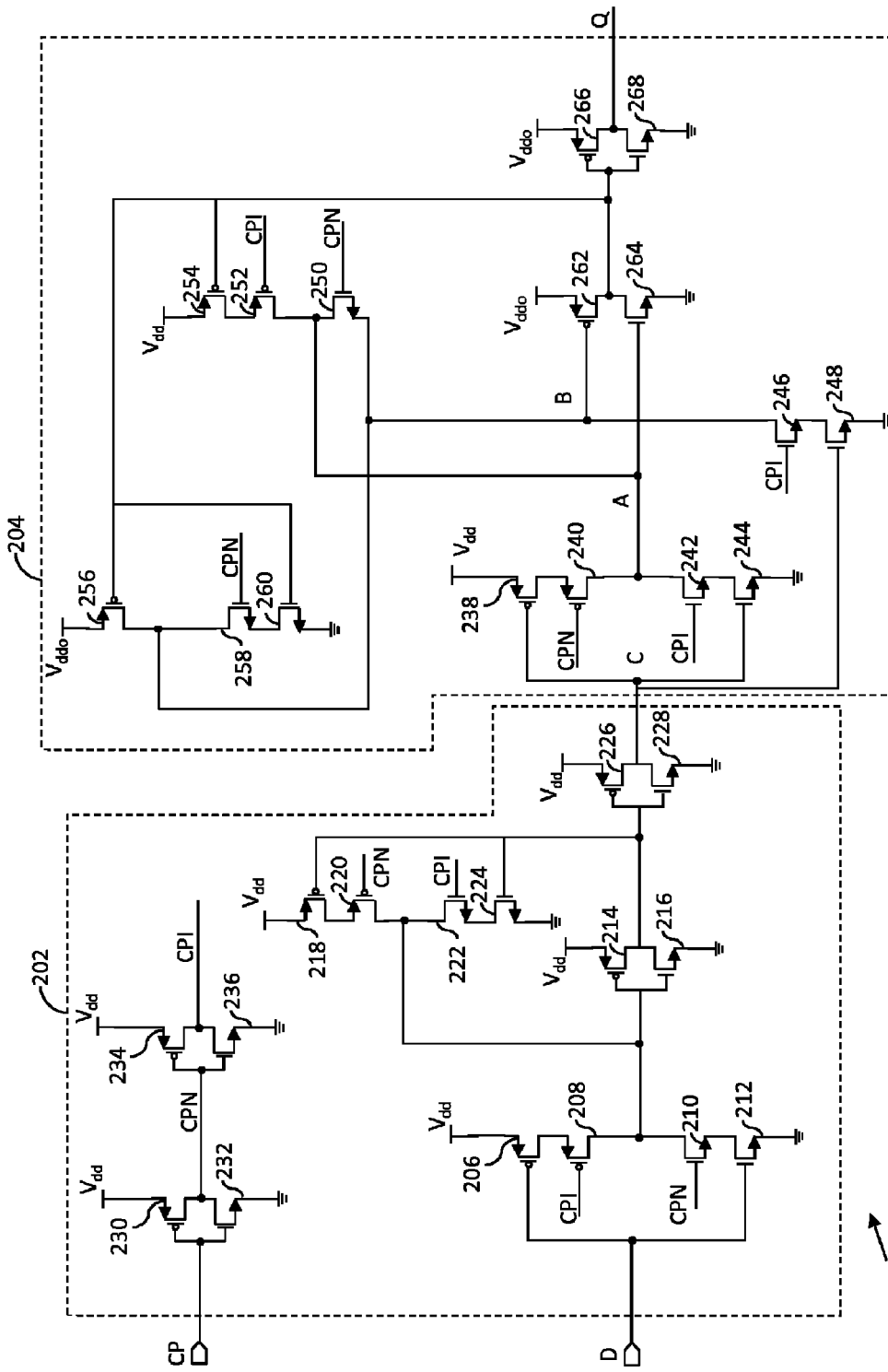
FIG. 2 is a schematic circuit diagram of a level shifting flip-flop in accordance with an embodiment of the present invention.

Referring now to FIG. 2, a schematic circuit diagram of a level shifting flip-flop 200 in accordance with an embodiment of the present invention is shown. The level shifting flip-flop 200 includes a master stage 202 and a slave stage 204. The master stage 202 includes sixteen transistors 206-236. The slave stage 204 also includes sixteen transistors (seventeenth through thirty-second transistors) 238-268.

A low voltage supply ($V_{dd}$) is connected to a source terminal of the first transistor 206 and a drain terminal of the first transistor 206 is connected to a source terminal of the second transistor 208. A drain terminal of the second transistor 208 is connected to a drain terminal of the third transistor 210 and a source terminal of the third transistor 210 is connected to a drain terminal of the fourth transistor 212. A source terminal of the fourth transistor 212 is connected or shorted to ground. Gate terminals of the first and fourth transistors 206 and 212 are connected to a data input terminal of the level-shifting flip-flop 200 and receive an input signal (D). Gate terminals of the second and third transistors 208 and 210 receive an internal clock signal (CPI) and an inverted clock signal (CPN), respectively. The drain terminals of the second and third transistors 208 and 210 are connected to gate terminals of the fifth and sixth transistors 214 and 216. The low-voltage supply ($V_{dd}$) also is provided to a source terminal of the fifth transistor 214 and a drain terminal of the fifth transistor is connected to a drain terminal of the sixth transistor 216. A source terminal of the sixth transistor 216 is connected to ground.

A source terminal of the seventh transistor 218 is connected to the low-voltage supply ($V_{dd}$) and a drain terminal thereof is connected to a source terminal of the eighth transistor 220. A drain terminal of the eighth transistor 220 is connected to a drain terminal of the ninth transistor 222 and a source terminal of the ninth transistor 222 is connected to a drain terminal of the tenth transistor 224. A source terminal of the tenth transistor 224 is connected to ground. The gate terminals of the seventh and tenth transistors 218 and 224 are connected to the drain terminals of the fifth and sixth transistors 214 and 216, and the drain terminals of the eighth and ninth transistors 220 and 222 are connected to the gate terminals of the fifth and sixth transistors 214 and 216. Gate terminals of the eighth and ninth transistors 220 and 222 receive the inverted clock signal (CPN) and the internal clock signal (CPI), respectively.

The drain terminals of the fifth and sixth transistors 214 and 216 are connected to the input of a first inverter. The first inverter is formed with a PMOS transistor connected to a NMOS transistor in a manner known to those of skill in the art. More particularly, gate terminals of the eleventh and twelfth transistors 226 and 228, which are the input to the first inverter, are connected to the drain terminals of the fifth and sixth transistors 214, 216. A source terminal of the eleventh transistor 226 is connected to the low voltage supply ($V_{dd}$) and a drain terminal thereof is connected to a drain terminal of the twelfth transistor 228 at a node C, which is the output of the first inverter. A source terminal of the twelfth transistor 228 is connected to ground.

The master stage also has second and third inverters, which are connected in series. The second inverter receives the clock signal CP and generates the inverted clock signal CPN. The third inverter receives the inverted clock signal CPN and generates the internal clock signal CPI.

In more detail, the second inverter comprises thirteenth and fourteenth transistors 230, 232 and the third inverter comprises the fifteenth and sixteenth transistors 234, 236. The gate terminals of the thirteenth and fourteenth transistors 230 and 232 are connected together and receive the clock signal CP. A source terminal of the thirteenth transistor 230 is connected to the low-voltage supply ($V_{dd}$) and a drain terminal thereof is connected to a drain terminal of the fourteenth transistor 232. A source terminal of the fourteenth transistor 232 is connected to ground. The drain terminals of the thirteenth and fourteenth transistors 230 and 232 are together connected to a third inverter so that the inverted clock signal CPN is input to the third inverter, which then generates an internal clock signal CPI. The third inverter comprises fifteenth and sixteenth transistors 234 and 236. A source terminal of the fifteenth transistor 234 is connected to the low-voltage supply ($V_{dd}$) and its drain terminal is connected to a drain terminal of the sixteenth transistor 236. A source terminal of the sixteenth transistor 236 is connected to ground. The gate terminals of the fifteenth and sixteenth transistors 234, 236 receive the inverted clock signal CPN and the drain terminals of the fifteenth and sixteenth transistors provide the internal clock signal CPI.

A source terminal of the seventeenth transistor 238 is connected to the low-voltage supply ($V_{dd}$) and a drain terminal of the seventeenth transistor 238 is connected to a source terminal of the eighteenth transistor 240. A drain terminal of the eighteenth transistor 240 is connected to a drain terminal of the nineteenth transistor 242 at a node A, and a source terminal of the nineteenth transistor 242 is connected to a drain terminal of the twentieth transistor 244. A source terminal of the twentieth transistor 244 is connected to ground. The gate terminals of the seventeenth and twentieth transistors 238 and 244 are connected to the drain terminals of the eleventh and twelfth transistors 226 and 228, at the node C, and receive the master stage output signal. The gate terminals of the eighteenth and nineteenth transistors 240 and 242 receive the inverted clock signal CPN and the internal clock signal CPI, respectively.

A source terminal of the twenty-first transistor 246 is connected to a drain terminal of the twenty-second transistor 248. A source terminal of the twenty-second transistor 248 is connected to ground. A gate terminal of the twenty-first transistor 246 receives the internal clock signal CPI and a gate terminal of the twenty-second transistor 248 is connected to the Node C and receives the master stage output signal. A drain terminal of the twenty-first transistor 246 is connected to a source terminal of the twenty-third transistor 250 at a node B. A drain terminal of the twenty-third transistor 250 is connected to a drain terminal of the twenty-fourth transistor 252 and to the node A. The gate of the twenty-third transistor 250 receives the inverted clock signal CPN and the gate of the twenty-fourth transistor 252 receives the internal clock signal CPI. A source terminal of the twenty-fourth transistor 252 is connected to a drain terminal of the twenty-fifth transistor 254 and a source terminal of the twenty-fifth transistor 254 is connected to the low-voltage supply ($V_{dd}$).

A source terminal of the twenty-sixth transistor 256 is connected to a high-voltage supply ($V_{ddo}$) and a drain terminal of the twenty-sixth transistor 256 is connected to a drain terminal of the twenty-seventh transistor 258 and to the node B. A gate terminal of the twenty-sixth transistor 256 is connected to a gate terminal of the twenty-fifth transistor 254. A source terminal of the twenty-seventh transistor 258 is connected to a drain terminal of the twenty-eighth transistor 260 and a source terminal of the twenty-eighth transistor 260 is connected to ground. A gate terminal of the twenty-seventh transistor 258 receives the inverted clock signal CPN and a gate terminal of the twenty-eighth transistor 260 is connected to the gate terminal of the twenty-sixth transistor 256. The drain terminals of the twenty-sixth and twenty-seventh transistors 256 and 258 are connected to the drain terminal of the twenty-first transistor 246 by way of the node B.

A source terminal of the twenty-ninth transistor 262 is connected to a high-voltage supply ($V_{ddo}$) and its drain terminal is connected to a drain terminal of the thirtieth transistor 264. A source terminal of the thirtieth transistor 264 is connected to ground. The drain terminals of the twenty-ninth and thirtieth transistors 262 and 264 are connected to the input of a fourth inverter and the output of the fourth inverter is the level shifted output signal. The fourth inverter comprises the thirty-first and thirty-second transistors 266, 268. The gates terminals of the thirty-first and thirty-second transistors 266 and 268 are connected to the drain terminals of the twenty-ninth and thirtieth transistors 262, 264. A source terminal of the thirty-first transistor 266 is connected to a high-voltage supply ($V_{ddo}$) and its drain terminal is connected to a drain terminal of the thirty-second transistor 268. A source terminal of the thirty-second transistor 268 is connected to ground.

In an embodiment of the present invention, the level-shifting flip-flop 200 is a D-type positive-edge-triggered flip-flop that captures the input signal D during a low-phase of the clock signal. Thereafter, the output signal (which is same as the input signal) is generated during a high-phase of the clock signal CP. When the clock signal CP is low, the master stage 202 captures the input signal D and the output signal Q is maintained at a previous output value by the slave stage 204. Subsequently, when the clock signal CP is high, the slave stage 204 outputs the captured data as the output signal Q and an output of the master stage 202 is maintained at a previous captured value.

The operation of the level-shifting flip-flop 200 is explained below using exemplary values in which the clock pulse CP is low, i.e., CP=0, and the input signal D is high, i.e., D=1.

When CP=0, D=0, CPN=1, and CPI=0, the first, second, and third transistors 206, 208 and 210 are switched on and the fourth transistor 212 is switched off, that causes the drain terminal of the second transistor 208 to be pulled up to a level of the low-voltage supply ($V_{dd}$), i.e., logic high level, thereby generating an master stage output signal that is at a logic high level. The master stage output signal is provided to the gate terminals of the fifth and sixth transistors 214 and 216 and the drain terminals of the eighth and ninth transistors 220 and 222. The master stage output signal switches off the fifth transistor 214 and switches on the sixth transistor 216. The fifth and sixth transistors 214 and 216 invert the master stage output signal to generate a clocked input signal that is at a logic low level. The clocked input signal switches on and off the seventh and tenth transistors 218 and 224, respectively. Further, the clocked input signal is provided to the gate terminals of the eleventh and twelfth transistors 226 and 228 causing them to be respectively switched on and off. The eleventh and twelfth transistors 226 and 228 invert the clocked input signal to generate the master stage output signal that is at a logic high level.

The eighteenth and nineteenth transistors 240 and 242 are switched off by the inverted clock signal CPN and the internal clock signal CPI, respectively. As a result, the master stage output signal does not cross beyond the master stage 202 to the output terminal of the slave stage 204 (i.e., to the output terminal of the level-shifting flip-flop 200). The output terminal of the slave stage 204 maintains a valid logic value, i.e., either a logic low or a level-shifted high value, which is equal to an output signal from a previous clock cycle.

In an example when Q=1, the output terminal of the slave stage 204 is driven to a level of the high-voltage supply ($V_{ddo}$), thereby generating a level-shifted output signal. Further, since CPI=0, the twenty-first transistor 246 is switched off. Since the thirty-first and thirty-second transistors 266 and 268 form an inverter and the output signal is at a logic high level, the drain terminals of the twenty-ninth and thirtieth transistors 262 and 264 remain at logic low level. Since the twenty-ninth and thirtieth transistors 262 and 264 also form an inverter, the voltage at the node A is at logic high level. The twenty-third and twenty-fourth transistors 250 and 252 are switched on when CPI=0 and CPN=1, and the twenty-fifth and twenty-sixth transistors 254 and 256 are switched on when the drain terminals of the twenty-ninth and thirtieth transistors 262 and 264 are at logic low level. The switching on of the twenty-fourth and twenty-fifth transistors 252 and 254 maintains logic high level at the node A even when the eighteenth and nineteenth transistors 240 and 242 are switched off. Additionally, when the twenty-fourth, twenty-fifth, and twenty-sixth transistors 252, 254, and 256 are switched on, voltage at the node B is pulled up to the level of the high-voltage supply ($V_{ddo}$) and a voltage at the node A is pulled down to the level of the low-voltage supply ($V_{dd}$) which ensures that the twenty-ninth and thirtieth transistors 262 and 264 are never switched on simultaneously and eliminates the possibility of a leakage current.

In another example, when Q=0, the node A is at logic low level and therefore the drain terminals of the twenty-ninth and thirtieth transistors 262 and 264 are at logic high level. As a result, the twenty-eighth transistor 260 is switched on. Since CPN=1, the twenty-third and twenty-seventh transistors 250 and 258 are switched on. As the twenty-third, twenty-seventh, and twenty-eighth transistors 250, 258, and 260 are switched on, voltages at the nodes A and B are maintained at logic low levels, thereby ensuring that the twenty-ninth and thirtieth transistors 262 and 264 are never switched on simultaneously and the leakage current is thus reduced or essentially eliminated.

In a second scenario when CP=1, D=0, CPN=0, and CPI=1, the eighth, ninth, fourteenth, and fifteenth transistors 220, 222, 232, 234 are switched on. Since CP=1, the drain terminals of the eleventh and twelfth transistors 226 and 228, i.e., the node C, need to be maintained at a valid logic value that is equal to an input signal value captured in a previous clock cycle. The value maintained at the node C moves through the slave stage 204 and is received at the output terminal.

When the node C needs to be maintained at logic high level, output signal Q and the drain terminals of the fifth and sixth transistors 214 and 216 remain at logic low level, which switches on the seventh transistor 218. Since, the eighth and ninth transistors 220 and 222 are also switched on, the drain terminals thereof are pulled up to the level of the low-voltage supply ($V_{dd}$) that causes the gate terminals of the fifth and sixth transistors 214 and 216 to be pulled up to the level of the low-voltage supply ($V_{dd}$), i.e., to logic high value. The logic high value at the gate terminals of the fifth and sixth transistors 214 and 216 maintains logic low value at the drain terminals thereof, which in turn maintains logic high value at the drain terminals of the eleventh and twelfth transistors 226 and 228, i.e., at the node C. Since CPN=0, CPI=1, and the node C is at logic high value, the eighteenth, nineteenth, and twentieth transistors 240, 242, and 244 are switched on. As a result, the voltage at the node A is pulled down to ground potential, i.e., logic low level, which switches off the thirtieth transistor 264. Since CPI=1 and the node C is at logic high level, the twenty-first and twenty-second transistors 246 and 248 are switched on and pull down the node B to ground potential, which in turn switches on the twenty-ninth transistor 262, drives the drain terminal thereof to logic high level, and switches on the thirty-second transistor 268. Therefore, the output terminal (drain terminals of the thirty-first and thirty-second transistors 266 and 268) of the level-shifting flip-flop 200 is pulled down to ground potential. Further, the twenty-fourth, twenty-fifth, and twenty-sixth transistors 252, 254, and 256 are switched off.

When the node C needs to be maintained at logic low level, output signal Q and the drain terminals of the fifth and sixth transistors 214 and 216 remain at logic high level, which switches off the seventh transistor 218 and switches on the tenth transistor 224. Since the eighth and ninth transistors 220 and 222 are also switched on, their drain terminals are pulled down to ground potential, which causes the gate terminals of the fifth and sixth transistors 214 and 216 to be pulled down to ground potential, i.e., to logic low value. The logic low value at the gate terminals of the fifth and sixth transistors 214 and 216 maintains logic high value at the drain terminals thereof, which in turn maintains logic low value at the drain terminals of the eleventh and twelfth transistors 226 and 228, i.e., at the node C.

Since CPN=0, CPI=1, and the node C is at logic low value, the seventeenth, eighteenth, and nineteenth transistors 238, 240, and 242 are switched on, thereby pulling-up the voltage at the node A to the level of the low-voltage supply $V_{dd}$, i.e., to logic high level. The pulling-up of the voltage at the node A switches on the thirtieth transistor 264, which in turn pulls down the drain terminals of the twenty-ninth and thirtieth transistors 262 and 264 to ground potential. As a result, the thirty-first transistor 266 is switched on and pulls up the drain terminal thereof, i.e., the output terminal of the level-shifting flip-flop 200, to the level of the high-voltage supply ($V_{ddo}$), thereby generating a level-shifted output signal. Additionally, the pulling-down of the drain terminals of the twenty-ninth and thirtieth transistors 262 and 264 to ground potential switches on the twenty-sixth transistor 256, thereby maintaining the voltage at node B at the level of the high-voltage supply $V_{ddo}$. This ensures that twenty-ninth transistor 262 is switched off and prevents any leakage current (since the thirtieth transistor 264 is switched on).

In various embodiments of the present invention, the level-shifting flip-flop 200 generates a level-shifted output signal that has a higher voltage level than that of the input signal. However, a skilled artisan will understand that the level-shifting flip-flop 200 may also be used to generate a level-shifted output signal that has a lower voltage level as compared with the voltage level of the input signal. To generate the level-shifted output signal having a lower voltage level as compared with the voltage level of the input signal, the low and high voltage supplies ($V_{dd}$) and ($V_{ddo}$) may be interchanged with one another.

In various embodiment of the present invention, the first, second, fifth, seventh, eighth, eleventh, thirteenth, fifteenth, seventeenth, eighteenth, twenty-fourth, twenty-fifth, twenty-sixth, twenty-ninth, and thirty-first transistors 206, 208, 214, 218, 220, 226, 230, 234, 238, 240, 252, 254, 256, 262, and 266 are p-channel metal-oxide semiconductor (PMOS) transistors. Further, the third, fourth, sixth, ninth, tenth, twelfth, fourteenth, sixteenth, nineteenth, twentieth, twenty-first, twenty-second, twenty-third, twenty-seventh, twenty-eighth, thirtieth, and thirty-second transistors 210, 212, 216, 222, 224, 228, 232, 236, 242, 244, 246, 248, 250, 258, 260, 264, and 268 are n-channel metal-oxide semiconductor (NMOS) transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A flip-flop circuit for generating a level-shifted output signal based on an input signal and a clock signal, comprising:
 a master stage for receiving the input signal and the clock signal and generating an inverted clock signal, an internal clock signal, and a master stage output signal based on the input signal and the clock signal, the master stage including:
  a first transistor having a source terminal that receives a first supply voltage, and a gate terminal for receiving the input signal;
  a second transistor having a source terminal connected to a drain terminal of the first transistor, and a gate terminal for receiving the internal clock signal;
  a third transistor having a drain terminal connected to a drain terminal of the second transistor, and a gate terminal that receives the inverted clock signal;
  a fourth transistor having a drain terminal connected to a source terminal of the third transistor, a gate terminal for receiving the input signal, and a source terminal connected to ground;
  a fifth transistor having a source terminal that receives the first supply voltage, and a gate terminal connected to the drain terminals of the second and third transistors;
  a sixth transistor having a drain terminal connected to a drain terminal of the fifth transistor, for generating a clocked input signal, a gate terminal connected to the gate terminal of the fifth transistor, and a source terminal connected to ground;
  a first inverter having an input connected to the drain terminals of the fifth and sixth transistors for receiving the clocked input signal, and an output that provides the master stage output signal;
  a seventh transistor having a source terminal that receives the first supply voltage, and a gate terminal connected to the drain terminals of the fifth and sixth transistors for receiving the clocked input signal;
  an eighth transistor having a source terminal connected to a drain terminal of the seventh transistor, and a gate terminal that receives the inverted clock signal;
  a ninth transistor having a drain terminal connected to a drain terminal of the eighth transistor, and a gate terminal that receives the internal clock signal,
  wherein the drain terminals of the eighth and ninth transistors are connected to the gate terminals of the fifth and sixth transistors; and
  a tenth transistor having a drain terminal connected to a source terminal of the ninth transistor, a gate terminal connected to the drain terminals of the fifth and sixth transistors for receiving the clocked input signal, and a source terminal connected to ground;
  a second inverter having an input that receives the clock signal and an output that provides the inverted clock signal; and
  a third inverter having an input connected to the output of the second inverter and receiving the inverted clock signal, and an output that provides the internal clock signal; and
 a slave stage, connected to the master stage, for generating the level-shifted output signal, the slave stage including:
  a seventeenth transistor having a source terminal that receives the first supply voltage, and a gate terminal connected to the output of the first inverter and receiving the master stage output signal;
  an eighteenth transistor having a source terminal connected to a drain terminal of the seventeenth transistor, and a gate terminal that receives the inverted clock signal;
  a nineteenth transistor having a drain terminal connected to a drain terminal of the eighteenth transistor, and a gate terminal that receives the internal clock signal;
  a twentieth transistor having a drain terminal connected to a source terminal of the nineteenth transistor, a gate terminal connected to the gate terminal of the seventeenth transistor and the output of the first inverter, and a source terminal connected to ground;

a twenty-first transistor having a gate terminal that receives the internal clock signal;

a twenty-second transistor having a drain terminal connected to a source terminal of the twenty-first transistor, a gate terminal connected to the output of the first inverter and receiving the master stage output signal, and a source terminal connected to ground;

a twenty-third transistor having a source terminal connected to a drain terminal of the twenty-first transistor, a gate terminal that receives the inverted clock signal, and a drain terminal connected to the drain terminals of the eighteenth and nineteenth transistors;

a twenty-fourth transistor having a drain terminal connected to the drain terminal of the twenty-third transistor, and a gate terminal that receives the internal clock signal;

a twenty-fifth transistor having a source terminal that receives the first supply voltage, and a drain terminal connected to a source terminal of the twenty-fourth transistor;

a twenty-sixth transistor having a source terminal that receives a second supply voltage, a gate terminal connected to a gate terminal of the twenty-fifth transistor, and a drain terminal connected to the drain terminal of the twenty-first transistor;

a twenty-seventh transistor having a drain terminal connected to the drain terminal of the twenty-sixth transistor, and a gate terminal that receives the inverted clock signal;

a twenty-eighth transistor having a drain terminal connected to a source terminal of the twenty-seventh transistor, a source terminal connected to ground, and a gate terminal connected to the gate terminals of the twenty-fifth and twenty-sixth transistors;

a twenty-ninth transistor having a source terminal that receives the second supply voltage, a gate terminal connected to the drain terminal of the twenty-first transistor and the source terminal of the twenty-third transistor, and a drain terminal connected to the gate terminals of the twenty-fifth and twenty-sixth transistors;

a thirtieth transistor having a drain terminal connected to the drain terminal of the twenty-ninth transistor, a gate terminal connected to the drain terminals of the eighteenth and nineteenth transistors, and a source terminal connected to ground; and a fourth inverter connected between the second supply voltage and ground, wherein the fourth inverter has an input connected to the drain terminals of the twenty-ninth and thirtieth transistors, and an output that provides the level shifted output signal.

2. The flip-flop circuit of claim 1, wherein the first inverter comprises:

an eleventh transistor having a source terminal that receives the first supply voltage, and a gate terminal connected to the drain terminals of the fifth and sixth transistors for receiving the clocked input signal; and a twelfth transistor having a drain terminal connected to the drain terminal of the eleventh transistor, a gate terminal connected to the gate terminal of the eleventh transistor, and a source terminal connected to ground, wherein the master stage output signal is provided at the drain terminals of the eleventh and twelfth transistors.

3. The flip-flop circuit of claim 2, wherein the second inverter comprises:

a thirteenth transistor having a source terminal that receives the first supply voltage, a gate terminal for receiving the clock signal, and a drain terminal for generating the inverted clock signal; and a fourteenth transistor having a drain terminal connected to the drain terminal of the thirteenth transistor, a gate terminal connected to the gate terminal of the thirteenth transistor, and a source terminal connected to ground; and wherein the third inverter comprises:

a fifteenth transistor having a source terminal that receives the first supply voltage, a gate terminal connected to the drain terminals of the thirteenth and fourteenth transistors for receiving the inverted clock signal, and a drain terminal for generating the internal clock signal; and a sixteenth transistor having a drain terminal connected to the drain terminal of the fifteenth transistor, a gate terminal connected to the gate terminal of the fifteenth transistor, and a source terminal connected to ground.

4. The flip-flop circuit of claim 3, wherein the fourth inverter comprises:

a thirty-first transistor having a source terminal that receives the second supply voltage, and a gate terminal connected to the drain terminals of the twenty-ninth and thirtieth transistors; and a thirty-second transistor having a drain terminal connected to a drain terminal of the thirty-first transistor, for generating the level-shifted output signal, a gate terminal connected to the gate terminal of the thirty-first transistor, and a source terminal connected to ground.

5. The flip-flop circuit of claim 1, wherein the first, second, fifth, seventh, eighth, seventeenth, eighteenth, twenty-fourth, twenty-fifth, twenty-sixth, and twenty-ninth transistors are p-channel metal-oxide semiconductor (PMOS) transistors.

6. The flip-flop circuit of claim 5, wherein the third, fourth, sixth, ninth, tenth, nineteenth, twentieth, twenty-first, twenty-second, twenty-third, twenty-seventh, twenty-eighth, and thirtieth transistors are n-channel metal-oxide semiconductor (NMOS) transistors.

7. The flip-flop circuit of claim 1, wherein the second supply voltage is at least one of greater and smaller than the first supply voltage.

8. A flip-flop circuit for generating a level-shifted output signal based on an input signal and a clock signal, comprising:

a master stage for receiving the input signal and the clock signal and generating an inverted clock signal, an internal clock signal, and a master stage output signal based on the input signal and the clock signal; and a slave stage, connected to the master stage, for generating the level-shifted output signal based on the inverted clock signal, the internal clock signal, and the master stage output signal, the slave stage including:

a first transistor having a source terminal that receives a first supply voltage, and a gate terminal that receives the master stage output signal;

a second transistor having a source terminal connected to a drain terminal of the first transistor, and a gate terminal that receives the inverted clock signal;

a third transistor having a drain terminal connected to a drain terminal of the second transistor, and a gate terminal that receives the internal clock signal, wherein a clocked input signal is generated at a node between the drains of the second and third transistors;

a fourth transistor having a drain terminal connected to a source terminal of the third transistor, a gate terminal connected to the gate terminal of the first transistor and receiving the master stage output signal, and a source terminal connected to ground;

a fifth transistor having a gate terminal that receives the internal clock signal;

a sixth transistor having a drain terminal connected to a source terminal of the fifth transistor, a gate terminal connected to the gate terminal of the first transistor for receiving the master stage output signal, and a source terminal connected to ground;

a seventh transistor having a source terminal connected to a drain terminal of the fifth transistor, a gate terminal that receives the inverted clock signal, and a drain terminal connected to the drain terminals of the second and third transistors;

an eighth transistor having a drain terminal connected to the drain terminal of the seventh transistor, and a gate terminal for receiving the internal clock signal;

a ninth transistor having a source terminal that receiver the first supply voltage, and a drain terminal connected to a source terminal of the eighth transistor;

a tenth transistor having a source terminal that receives a second supply voltage, a gate terminal connected to a gate terminal of the ninth transistor, and a drain terminal connected to the source terminal of the seventh transistor;

an eleventh transistor having a drain terminal connected to the drain terminal of the tenth transistor, and a gate terminal that receives the inverted clock signal;

a twelfth transistor having a drain terminal connected to a source terminal of the eleventh transistor, a source terminal connected to ground, and a gate terminal connected to the gate terminal of the tenth transistor;

a thirteenth transistor having a source terminal that receives the second supply voltage, a gate terminal connected to the drain terminal of the fifth transistor and the source terminal of the seventh transistor, and a drain terminal connected to the gate terminal of the ninth transistor;

a fourteenth transistor having a drain terminal connected to the drain terminal of the thirteenth transistor, a source terminal connected to ground, and a gate terminal connected to the drain terminals of the second and third transistors for receiving the clocked input signal, wherein an inverted level-shifted output signal is output at the drain terminals of the thirteenth and fourteenth transistors; and a first inverter having an input connected to the drain terminals of the thirteenth and fourteenth transistors for receiving the inverted level shifted output signal, and an output terminal that provides the level shifted output signal.

9. The flip-flop circuit of claim 8, wherein the first inverter comprises:

a fifteenth transistor having a source terminal that receives the second supply voltage, and a gate terminal connected to the drain terminals of the thirteenth and fourteenth transistors for receiving the inverted level-shifted output signal; and a sixteenth transistor having a drain terminal connected to a drain terminal of the fifteenth transistor, a source terminal connected to ground, and a gate terminal connected to drain terminals of the thirteenth and fourteenth transistors and the gate terminal of the fifteenth transistor, wherein the level shifted output signal is generated at the drain terminals of the fifteenth and sixteenth transistors.

10. The flip-flop circuit of claim 9, wherein the master stage includes:

a seventeenth transistor having a source terminal that receives the first supply voltage, and a gate terminal for receiving the input signal;

an eighteenth transistor having a source terminal connected to a drain terminal of the seventeenth transistor, and a gate terminal that receives the internal clock signal;

a nineteenth transistor having a drain terminal connected to a drain terminal of the eighteenth transistor, and a gate terminal that receives the inverted clock signal;

a twentieth transistor having a drain terminal connected to a source terminal of the nineteenth transistor, a gate terminal for receiving the input signal, and a source terminal connected to ground;

a second inverter having an input connected to the drain terminals of the eighteenth and nineteenth transistors;

a twenty-third transistor having a source terminal that receives the first supply voltage, and a gate terminal connected to an output of the second inverter;

a twenty-fourth transistor having a source terminal connected to a drain terminal of the twenty-third transistor, a gate terminal that receives the inverted clock signal, and a drain terminal connected to the input of the second inverter;

a twenty-fifth transistor having a drain terminal connected to the drain terminal of the twenty-fourth transistor, and a gate terminal that receives the internal clock signal;

a twenty-sixth transistor having a drain terminal connected to a source terminal of the twenty-fifth transistor, a gate terminal connected to the gate terminal of the twenty-third transistor and the output of the second inverter, and a source terminal connected to ground; and a third inverter having an input connected to the output of the second inverter and to the gates of the twenty-third and twenty-sixth transistors, and an output that provides the master stage output signal.

11. The flip-flop circuit of claim 10, wherein the second inverter comprises:

a twenty-first transistor having a source terminal for receiving the first supply voltage, and a gate terminal connected to the drain terminals of the eighteenth and nineteenth transistors;

a twenty-second transistor having a drain terminal connected to a drain terminal of the twenty-first transistor, for generating the clocked input signal, a gate terminal connected to the gate terminal of the twenty-first transistor, and a source terminal connected to ground.

12. The flip-flop circuit of claim 11, wherein the third inverter comprises:

a twenty-seventh transistor having a source terminal that receives the first power supply voltage and a gate terminal connected to the drain terminals of the twenty-first and twenty-second transistors; and a twenty-eighth transistor having a drain terminal connected to a drain terminal of the twenty-seventh transistor, a gate terminal connected to the drain terminals of the twenty-first and twenty-second transistors, and a source terminal connected to ground.

13. The flip-flop circuit of claim 10, wherein the master stage further comprises:

a fourth inverter having an input that receives the clock signal and an output that provides the inverted clock signal; and a fifth inverter having an input connected to the output of the fourth inverter and an output that provides the internal clock signal.

14. The flip-flop circuit of claim 13, wherein the fourth inverter comprises:

a twenty-ninth transistor having a source terminal that receives the first supply voltage, a gate terminal for receiving the clock signal, and a drain terminal for generating the inverted clock signal; and a thirtieth transistor having a drain terminal connected to the drain terminal of the twenty-ninth transistor, a gate terminal connected to the gate terminal of the twenty-ninth transistor, and a source terminal connected to ground; and wherein the fifth inverter comprises:

a thirty-first transistor having a source terminal that receives the first supply voltage, a gate terminal connected to the drain terminals of the twenty-ninth and thirtieth transistors, for receiving the inverted clock signal, and a drain terminal for generating the internal clock signal; and a thirty-second transistor having a drain terminal connected to the drain terminal of the thirty-first transistor, a gate terminal connected to the gate terminal of the thirty-first transistor, and a source terminal connected to ground.

15. The flip-flop circuit of claim 10, wherein the first, second, eighth, ninth, tenth, thirteenth, seventeenth, eighteenth, and twenty-third transistors are p-channel metal-oxide semiconductor (PMOS) transistors.

16. The flip-flop circuit of claim 10, wherein the third, fourth, fifth, sixth, seventh, eleventh, twelfth, fourteenth, nineteenth, twentieth, and twenty-sixth transistors are n-channel metal-oxide semiconductor (NMOS) transistors.

17. The flip-flop circuit of claim 8, wherein the second supply voltage is different from the first supply voltage.

* * * * *